US011448959B2

(12) United States Patent
Zhang et al.

(10) Patent No.: US 11,448,959 B2
(45) Date of Patent: Sep. 20, 2022

(54) LIGNIN BASED LASER LITHOGRAPHY PROCESS FOR FABRICATING 3D GRAPHENE ELECTRODE AND METHOD

(71) Applicant: KING ABDULLAH UNIVERSITY OF SCIENCE AND TECHNOLOGY, Thuwal (SA)

(72) Inventors: Wenli Zhang, Thuwal (SA); Yongjiu Lei, Thuwal (SA); Husam Niman Alshareef, Garland, TX (US)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 17/259,326

(22) PCT Filed: Jul. 1, 2019

(86) PCT No.: PCT/IB2019/055606
§ 371 (c)(1),
(2) Date: Jan. 11, 2021

(87) PCT Pub. No.: WO2020/021361
PCT Pub. Date: Jan. 30, 2020

(65) Prior Publication Data
US 2021/0247692 A1 Aug. 12, 2021

Related U.S. Application Data

(60) Provisional application No. 62/756,353, filed on Nov. 6, 2018, provisional application No. 62/701,944, filed on Jul. 23, 2018.

(51) Int. Cl.
| | | |
|---|---|---|
| G03F 7/00 | (2006.01) | |
| G03F 7/038 | (2006.01) | |
| G03F 7/30 | (2006.01) | |
| C08L 29/04 | (2006.01) | |
| C08L 97/00 | (2006.01) | |
| G03F 7/039 | (2006.01) | |
| G03F 7/20 | (2006.01) | |
| G03F 7/26 | (2006.01) | |
| H01G 11/36 | (2013.01) | |
| C01B 32/182 | (2017.01) | |
| G03F 7/32 | (2006.01) | |

(52) U.S. Cl.
CPC ............ G03F 7/0037 (2013.01); C08L 29/04 (2013.01); C08L 97/005 (2013.01); G03F 7/038 (2013.01); G03F 7/0392 (2013.01); G03F 7/2053 (2013.01); G03F 7/265 (2013.01); G03F 7/30 (2013.01); H01G 11/36 (2013.01); C01B 32/182 (2017.08); G03F 7/322 (2013.01)

(58) Field of Classification Search
CPC ...... G03F 7/0037; G03F 7/2053; G03F 7/038; G03F 7/20; H01G 11/36
See application file for complete search history.

(56) References Cited

U.S. PATENT DOCUMENTS

| 9,455,094 B2 * | 9/2016 | Tour ................... B82Y 40/00 |
|---|---|---|
| 9,688,540 B2 * | 6/2017 | Davis .................. C23C 16/04 |
| 2016/0016804 A1 * | 1/2016 | Li ....................... C01B 32/182 |
| | | 252/511 |
| 2017/0113936 A1 * | 4/2017 | Zhang ................. B01J 23/745 |
| 2018/0001553 A1 * | 1/2018 | Buller ................ B29C 64/393 |
| 2018/0346337 A1 * | 12/2018 | Tour ................... H01M 4/583 |
| 2019/0330064 A1 * | 10/2019 | Tour ................... H01M 4/583 |

FOREIGN PATENT DOCUMENTS

WO   2018085789 A1   5/2018

OTHER PUBLICATIONS

Mahmood et al, Transforming Lignin Into Porous Graphene via Direct Laser Writing for Solid-State Supercapacitors, Jul. 23, 2019, The Royal Society of Chemistry, vol. 9, pp. 22713-22720 (Year: 2019).*
Beidaghi, M., et al., "Capacitive Energy Storage in Micro-Scale Devices: Recent Advances in Design and Fabrication of Micro-Supercapacitors," Energy and Environmental Science, Jan. 2, 2014, vol. 7, pp. 867-884, The Royal Society of Chemistry.
Cai, J., et al., "Cost-Effective Fabrication of High-Performance Flexible All-Solid-State Carbon Micro-Supercapacitors by Blue-Violet Laser Direct Writing and Further Surface Treatment," Journal of Materials Chemistry A, Jan. 8, 2016, vol. 4, pp. 1671-1679, The Royal Society of Chemistry.
Cai, J., et al., "Laser Direct Writing of High-Performance Flexible All-Solid-State Carbon Micro-Supercapacitors for an On-Chip Self-Powered Photodetection System," Nano Energy, Sep. 9, 2016, vol. 30, pp. 790-800, Elsevier Ltd.
Chyan, Y., et al., "Laser-Induced Graphene by Multiple Lasing: Toward Electronics on Cloth, Paper, and Food," ASC Nano, Feb. 13, 2018, vol. 12, No. 3, pp. 2176-2183, A-H, American Chemical Society.
Clerici, F., et al., "In situ MoS2 Decoration of Laser-Induced Graphene as Flexible Supercapacitor Electrodes," ACS Applied Matter Interfaces, Apr. 1, 2016, vol. 8, pp. 10459-10465, American Chemical Society.

(Continued)

*Primary Examiner* — John S Chu
(74) *Attorney, Agent, or Firm* — Patent Portfolio Builders PLLC

(57) ABSTRACT

There is a method for forming a three dimensional or porous graphene electrode pattern on a substrate, the method including providing a substrate; coating the substrate with a lignin-polymer composite film; exposing a first part of the coated lignin-polymer composite film to a laser beam for transforming the first part into the graphene pattern; and removing a second part of the coated lignin-polymer composite film, which was not exposed to the laser beam, by placing the second part in water. The lignin-polymer composite film includes (1) a water-soluble alkaline lignin, (2) a polymer having bonding properties, and (3) a solvent, and an amount of the water-soluble alkaline lignin in the lignin-polymer composite film is between 5 and 60% by weight.

12 Claims, 12 Drawing Sheets

(56) References Cited

OTHER PUBLICATIONS

De Araujo, W.R., et al., "Single-Step Reagentless Laser Scribing Fabrication of Electrochemical Paper-Based Analytical Devices," Angewandte Chemie, Nov. 20, 2017, vol. 129, pp. 15309-15313, Wiley-VCH Verlag GmbH & Co. KGaA, Weinheim.
Delekta, S.S., et al., "Inkjet Printed Highly Transparent and Flexible Graphene Micro-Supercapacitors," Nanoscale, May 17, 2017, vol. 9, pp. 6998-7005, The Royal Society of Chemistry.
Duy, L.X., et al., "Laser-Induced Graphene Fibers," Carbon, Oct. 13, 2017, vol. 126, pp. 472-479, Elsevier Ltd.
El-Kady, M.F., et al., "Direct Laser Writing of Graphene Electronics," ACS Nano, Sep. 12, 2014, vol. 8, No. 9, pp. 8725-8729, American Chemical Society.
El-Kady, M.F., et al., "Laser Scribing of High-Performance and Flexible Graphene-Based Electrochemical Capacitors," Science, Mar. 16, 2012, vol. 335, pp. 1326-1330.
Ferrari, A.C., et al., "Raman Spectrum of Graphene and Graphene Layers," Physical Review Letters, Nov. 3, 2006, vol. 97, 187401, 4 pages, The American Physical Society.
Gao, W., et al., "Direct Laser Writing of Micro-Supercapacitors on Hydrated Graphite Oxide Films," Nature Nanotechnology, Aug. 2011, vol. 6, pp. 496-500, Macmillan Publishers Limited.
Hwang, J.Y., et al., "Next-Generation Activated Carbon Supercapacitors: A Simple Step in Electrode Processing Leads to Remarkable Gains in Energy Density," Advanced Functional Materials, Mar. 7, 2017, vol. 27, 1605745, 9 pages, Wiley-VCH Verlag GmbH & Co. KGaA, Weinheim.
In, J.B., et al., "Facile Fabrication of Flexible All Solid-State Micro-Supercapacitor by Direct Laser Writing of Porous Carbon in Polyimide," Carbone, Nov. 13, 2014, vol. 83, pp. 144 151, Elsevier Ltd.
International Search Report in corresponding/related International Application No. PCT/IB2019/055606, dated Oct. 28, 2019.
Jiang, Q., et al., "Hybrid Microsupercapacitors with Vertically Scaled 3D Current Collectors Fabricated using a Simple Cut-and-Transfer Strategy," Advanced Science News, Sep. 8, 2016, vol. 7, 1601257, 9 pages, Wiley-VCH Verlag GmbH & Co. KGaA, Weinheim.
Kurra, N., et al., "A General Strategy for the Fabrication of High Performance Microsupercapacitors," Science Direct, Jun. 4, 2015, vol. 16, pp. 1-9, Elsevier Ltd.
Kurra, N., et al., "MXene-on-Paper Coplanar Microsupercapacitors," Materials Views, Sep. 5, 2016, vol. 6, 1601372, 8 pages, Wiley-VCH Verlag GmbH & Co. KGaA, Weinheim.
Kyeremateng, N.A., et al., "Microsupercapacitors as Miniaturized Energy-Storage Components for On-Chip Electronics," Nature Nanotechnology, Nov. 7, 2016, vol. 12, pp. 7-15, Macmillan Publishers Limited.
Lamberti, A., et al., "A Highly Stretchable Supercapacitor Using Laser-Induced Graphene Electrodes onto Elastomeric Substrate," Advanced Energy Materials, Mar. 10, 2016, vol. 6, 1600050, 6 pages, Wiley-VCH Verlag GmbH & Co. KGaA, Weinheim.
Lee, H., et al., "All-Solid-State Flexible Supercapacitors by Fast Laser Annealing of Printed Metal Nanoparticle Layers," Journal of Materials Chemistry A, Mar. 12, 2015, vol. 3, pp. 8339-8345, the Royal Society of Chemistry.
Li, L., et al., "Flexible Planar Concentric Circular Micro-Supercapacitor Arrays for Wearable Gas Sensing Application," Nano Energy, Sep. 12, 2017, vol. 41, pp. 261-268, Elsevier Ltd.
Li, L., et al., "High-Performance Pseudocapacitive Microsupercapacitors from Laser-Induced Graphene," Advanced Materials, Dec. 3, 2015, vol. 28, pp. 838-845.
Li, L., et al., "High-Performance Solid-State Supercapacitors and Microsupercapacitors Derived from Printable Graphene Inks," Materials Views, Jul. 21, 2016, vol. 6, 1600909, 8 pages, Wiley-VCH Verlag GmbH & Co. KGaA, Weinheim.
Li, Y., et al., "A Superior Low-Cost Amorphous Carbon Anode Made from Pitch and Lignin for Sodium-Ion Batteries," Journals of Materials Chemistry A, Nov. 9, 2015, vol. 4, pp. 96-104, the Royal Society of Chemistry.
Li, Y., et al., "Laser-Induced Graphene in Controlled Atmospheres: From Superhydrophilic to Superhydrophobic Surfaces," Advanced Materials, May 12, 2017, vol. 29, 1700496, 8 pages, Wiley-VCH Verlag GmbH & Co. KGaA, Weinheim.
Lin, J., et al., "Laser-Induced Porous Graphene Films from Commercial Polymers," Nature Communications, Dec. 10, 2014, 8 pages, Macmillan Publishers Limited.
Liu, Z., et al., "Ultraflexible In-Plane Micro-Supercapacitors by Direct Printing of Solution-Processable Electrochemically Exfoliated Graphene," Materials Views, Jan. 19, 2016, vol. 28, pp. 2217-2222, Wiley-VCH Verlag GmbH & Co. KGaA, Weinheim.
Luo, S., et al., "Direct Laser Writing for Creating Porous Graphitic Structures and Their Use for Flexible and Highly Sensitive Sensor and Sensor Arrays," Carbon, Sep. 28, 2015, vol. 96, pp. 522-531, Elsevier Ltd.
Nayak, P., et al., "Highly Efficient Laser Scribed Graphene Electrodes for On-Chip Electrochemical Sensing Applications," Advanced Electronic Materials, Aug. 11, 2016, vol. 2, 1600185,11 pages, Wiley-VCH Verlag GmbH & Co. KGaA, Weinheim.
Nayak, P., et al., "Monolithic Laser Scribed Graphene Scaffolds with Atomic Layer Deposited Platinum for the Hydrogen Evolution Reaction," Journal of Materials Chemistry A, Sep. 1, 2017, vol. 5, pp. 20422-20427, The Royal Society of Chemistry.
Pandey, M.P., et al., "Lignin Depolymerization and Conversion: A Review of Thermochemical Methods," Chemical & Engineering Technology, Nov. 15, 2010, vol. 34, No. 1, pp. 29-41, Wiley-VCH Verlag GmbH & Co. KGaA, Weinheim.
Pech, D., et al., "Elaboration of a Microstructured Inkjet-Printed Carbon Electrochemcial Capacitor," Journal of Power Sources, Sep. 6, 2009, vol. 195, pp. 1266-1269, Elsevier B.V.
Pech, D., et al., "Ultrahigh-Power Micrometre-Sized Supercapacitors Based on Onion-Like Carbon," Nature Nanotechnology, Aug. 15, 2010, vol. 5, pp. 651-654, Macmillan Publishers Limited.
Peng, Z., et al., "Flexible and Stackable Laser-Induced Graphene Supercapacitors," ACS Applied Materials & Interfaces, Jan. 13, 2015, vol. 7, pp. 3414-3419, American Chemical Society.
Peng, Z., et al., "Flexible Boron-Doped Laser-Induced Graphene Microsupercapacitors," ACS Nano, May 15, 2015, vol. 9, No. 6, pp. 5868-5875.
Pu, X., et al., "Wearable Textile-Based In-Plane Microsupercapacitors," Advanced Energy Materials, Aug. 26, 2016, vol. 6, 1601254, 7 pages, Wiley-VCH Verlag GmbH & Co. KGaA, Weinheim.
Ragauskas, A.J., et al., "Lignin Valorization: Improving Lignin Processing in the Biorefinery," Science, vol. 344, May 16, 2014, 1246843, 10 pages, AAAS.
Serna, M.I., et al., "Large-Area Deposition of MoS2 by Pulsed Laser Deposition with In Situ Thickness Control," ACS Nano, May 24, 2016, vol. 10, pp. 6054 6061, American Chemical Society.
Singh, S.P., et al., "Laser-Induced Graphene Layers and Electrodes Prevents Microbial Fouling and Exerts Antimicrobial Action," ACS Applied Materials & Interfaces, May 18, 2017, vol. 9, pp. 18238-18247, American Chemical Society.
Singh, S.P., et al., "Sulfur-Doped Laser-Induced Porous Graphene Derived from Polysulfone-Class Polymers and Membranes," Dec. 14, 2017, pp. A-I, American Chemical Society.
Strauss, V., et al., "A Simple Route to Porous Graphene from Carbon Nanodots for Supercapacitor Applications," Advanced Materials, Jan. 10, 2018, 1704449, 10 pages, Wiley-VCH Verlag GmbH & Co. KGaA, Weinheim.
Tao, L.-Q., et al., "An Intelligent Artificial Throat with Sound-Sensing Ability Based on Laser Induced Graphene," Nature Communications, Feb. 24, 2017, 8 pages.
Wan, Z., et al., "Laser-Reduced Graphene: Synthesis, Properties, and Applications," Advanced Materials Technologies, Feb. 16, 2018, 1700315, 19 pages, Wiley-VCH Verlag GmbH & Co KGaA, Weinheim.
Written Opinion of the International Searching Authority in corresponding/related International Application No. PCT/IB2019/055606, dated Oct. 28, 2019.
Xu, X., et al., "Flexible, Highly Graphitized Carbon Aerogels Based on Bacterial Cellulose/Lignin: Catalyst-Free Synthesis and its Appli-

(56) References Cited

OTHER PUBLICATIONS cation in Energy Storage Devices," Advanced Functional Materials, Apr. 15, 2015, vol. 25, pp. 3193-3202, Wiley-VCH Verlag GmbH & Co. KGaA, Weinheim.

Yadav, P., et al., "Highly Stable Laser-Scribed Flexible Planar Microsupercapacitor Using Mushroom Derived Carbon Electrodes," Advanced Materials Interfaces, Feb. 29, 2016, vol. 3, 1600057, 9 pages, Wiley-VCH Verlag GmbH & Co. KGaA, Weinheim.

Ye, R., et al., "In Situ Formation of Metal Oxide Nanocrystals Embedded in Laser-Induced Graphene," ACS Nano, Aug. 18, 2015, vol. 9, No. 9, pp. 9244-9251, American Chemical Society.

Ye, R., et al., "Laser-Induced Graphene Formation on Wood," Advanced Materials, Jul. 24, 2017, vol. 29, 1702211, 7 pages, Wiley-VCH Verlag GmbH & Co KGaA, Weinheim.

Yeo, J., et al., "Flexible Supercapacitor Fabrication by Room Temperature Rapid Laser Processing of Roll-to-Roll Printed Metal Nanoparticle Ink for Wearable Electronics Application," Journal of Power Sources, Aug. 14, 2013, vol. 246, pp. 562-568, Elsevier B.V.

Zhang, J., et al., "Efficient Water-Splitting Electrodes Based on Laser-Induced Graphene," ACS Applied Materials & Interfaces, Jul. 28, 2017, vol. 9, pp. 26840-26847.

Zhang, W., et al., "3D Hierarchical Porous Carbon for Supercapacitors Prepared from Lignin through a Facile Template-Free Method," ChemSusChem, May 27, 2015, vol. 8, pp. 2114-2122, Wiley-VCH Verlag GmbH & Co. KGaA, Weinheim.

Zhu, Y.G., et al., "CoO Nanoflowers Woven by CNT Network for High Energy Density Flexible Micro-Supercapacitor," Science Direct, Oct. 16, 2013, vol. 3, pp. 46-54, Elsevier Ltd.

\* cited by examiner

_US 11,448,959 B2_

LIGNIN BASED LASER LITHOGRAPHY PROCESS FOR FABRICATING 3D GRAPHENE ELECTRODE AND METHOD

CROSS-REFERENCE TO RELATED APPLICATIONS

This application claims priority to U.S. Provisional Patent Application No. 62/701,944, filed on Jul. 23, 2018, entitled "LIGNIN BASED LASER LITHOGRAPHY PROCESS FOR FABRICATING 3D GRAPHENE ELECTRODE AND METHOD," and U.S. Provisional Patent Application No. 62/756,353, filed on Nov. 6, 2018, entitled "LIGNIN BASED LASER LITHOGRAPHY PROCESS FOR FABRICATING 3D GRAPHENE ELECTRODE AND METHOD," the disclosures of which are incorporated herein by reference in their entirety.

BACKGROUND

Technical Field

Embodiments of the subject matter disclosed herein generally relate to a lignin-based laser lithography technique, and more specifically, to a lignin-based lithography technique for fabricating micro-supercapacitors (MSCs), batteries, displays, electrocatalysis, and biosensors on a chip using 3D graphitic carbon electrodes.

Discussion of the Background

The rapid development of miniaturized electronic devices, such as micro-electromechanical systems, wireless sensors, implantable medical devices, and microrobots has stimulated the need for miniaturized energy storage devices. Compared with a micro-battery, micro-supercapacitors (MSCs) have attracted much attention for miniaturized energy storage devices due to their long life span (up to 10,000 cycles), high reversibility (coulombic efficiency and energy efficiency are both close to 100%), and high-power densities. Over the past decades, great efforts have been made for the miniaturization and integration of MSCs.

Generally, MSCs are fabricated as in-plane interdigitated electrodes through complex photo-lithography techniques inspired by the fabrication technology in semiconductor industry. The active materials of MSCs can be prepared by various well-developed methods, such as inkjet printing, screen printing, electrophoretic deposition, electrolytic deposition, and laser scribing (see, for example, N. Kurra, Q. Jiang, H. N. Alshareef, _Nano Energy,_ 2015, 16, 1, and M. F. El-Kady, V. Strong, S. Dubin, R. B. Kaner, _Science_ (80-.), 2012, 335, 1326).

Compared with other techniques, the laser scribing technology is a simple direct-write method that does not require photolithography masks. In previous studies, graphene films were prepared from hydrated graphene oxide (GO) through laser scribing technology, where GO could be reduced to rGO through the laser scribing procedure. However, the preparation of GO is complicated and time-consuming.

A more simple and direct approach is laser-scribing of polyimide, which was developed by Tour et al. who fabricated laser scribed graphene (LSG) electrodes from commercial Kapton® polyimide film by laser scribing technique (J. Lin, Z. Peng, Y. Liu, F. Ruiz-Zepeda, R. Ye, E. L. G. Samuel, M. J. Yacaman, B. I. Yakobson, J. M. Tour, _Nat. Commun.,_ 2014, 5, 5714). Different from thermal carbonization method, the laser scribing carbonization of polyimide provides LSG with highly porous structure and high conductivity. Since then, LSG has been used in micro-supercapacitors, electrocatalytic hydrogen generation, electrochemical oxygen evolution, sensors, and antimicrobial applications.

Recently, Tour et al. have extended the laser scribing technology to several polymers to make porous graphene films. Natural wood (R. Ye, Y. Chyan, J. Zhang, Y. Li, X. Han, C. Kittrell, J. M. Tour, _Adv. Mater.,_ 2017, 29, 1702211) and polysulfone-class polymers (C. J. Singh, S. P., Li, Y.; Zhang, J.; and Tour, J. M.; Arnusch, _ACS Nano,_ 2017) have been transformed into graphene by one-step laser scribing, and various natural-products, textile fabrics and even bread were transformed into graphene by multiple laser scribing technology (Y. Chyan, R. Ye, Y. Li, S. P. Singh, C. J. Arnusch, J. M. Tour, _ACS Nano,_ 2018, 12, 2176-2183).

However, the existing methods suffer from a limited selective growth of electroactive materials on a region exposed to the laser beam, and the substrate that can be used for the graphene is limited to some specific materials. Further, the existing processes cannot easily remove the unreacted polyamide.

Therefore, there is a need for a new method for growing graphene layers that is not being affected by the above discussed shortcomings and is also sustainable.

SUMMARY

According to an embodiment, there is a method for forming a three dimensional or porous graphene electrode pattern on a substrate. The method includes a step of providing a substrate, a step of coating the substrate with a lignin-polymer composite film, a step of exposing a first part of the coated lignin-polymer composite film to a laser beam for transforming the first part into the graphene pattern, and a step of removing a second part of the coated lignin-polymer composite film, which was not exposed to the laser beam, by placing the second part in water. The lignin-polymer composite film includes (1) a water-soluble alkaline lignin, (2) a polymer having bonding properties, and (3) a solvent, and an amount of the water-soluble alkaline lignin in the lignin-polymer composite film is between 5 and 60% by weight.

According to another embodiment, there is an electrode that includes a substrate, a lignin-polymer composite film coating the substrate, and a metallic layer coating the lignin-polymer composite film. A first part of the coated lignin-polymer composite film has been exposed to a laser beam that transformed the first part into a graphene pattern, a second part of the coated lignin-polymer composite film, which was not exposed to the laser beam, is removed by placing the second part in water, and the lignin-polymer composite film includes (1) a water-soluble alkaline lignin, (2) a polymer having bonding properties, and (3) a solvent, and an amount of the water-soluble alkaline lignin in the lignin-polymer composite film is between 5 and 60% by weight.

According to still another embodiment, there is a method for generating a graphene pattern on a substrate. The method includes a step of coating a substrate with a lignin-polymer composite film, a step of laser scribing a first part of the coated lignin-polymer composite film for transforming the first part into the graphene pattern, and a step of washing away with water a second part of the coated lignin-polymer composite film, which was not laser scribed. The lignin-polymer composite film includes (1) a water-soluble alkaline lignin, (2) a polymer having bonding properties, and (3) a solvent.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

Figure 1:
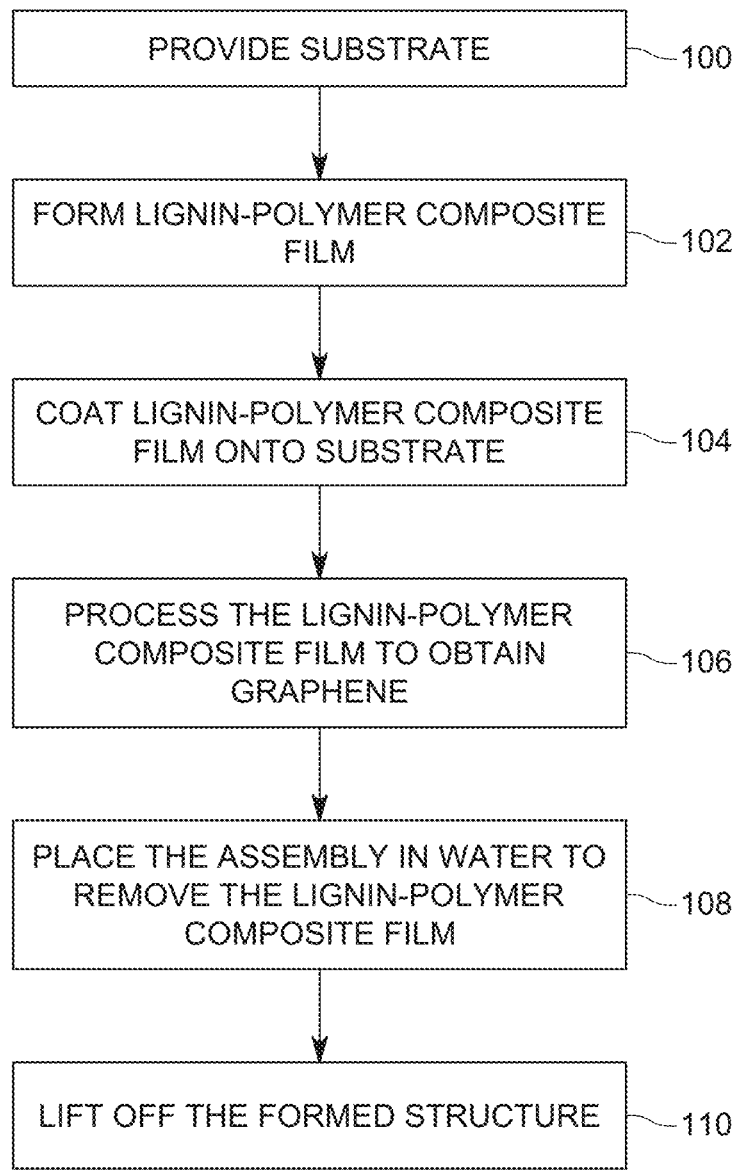
FIG. 1 is a flowchart of a method for forming a graphene structure from a lignin-polymer composite film using a laser scribing process.

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to a graphene electrode that may be used in a supercapacitor. However, the embodiments discussed herein are not limited to a graphene electrode or a supercapacitor, as the lignin derived graphene may be used for other purposes or in other electronic devices as a transistor, biosensors, batteries, displays, etc.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Lignin is an abundant natural aromatic polymer existing in natural plants. Thus, the transformation of lignin into high-value-added products has both scientific and commercial significance for the sustainable development of society. However, most lignin-derived-carbons are amorphous carbons up to now (Y. Li, Y.-S. Hu, H. Li, L. Chen, X. Huang, *J. Mater. Chem. A* 2016, 4, 96, or W. Zhang, H. Lin, Z. Lin, J. Yin, H. Lu, D. Liu, M. Zhao, *ChemSusChem* 2015, 8, 2114, or X. Xu, J. Zhou, D. H. Nagaraju, L. Jiang, V. R. Marinov, G. Lubineau, H. N. Alshareef, M. Oh, *Adv. Funct. Mater.* 2015, 25, 3193). Tour et. al. used alkali lignin as precursor to prepare LSG, but this group only obtained heavy oil (R. Ye, Y. Chyan, J. Zhang, Y. Li, X. Han, C. Kittrell, J. M. Tour, *Adv. Mater.* 2017, 29, 1702211). Although various lignin-containing materials can be transformed into LSG via multi-step lasing technique (Y. Chyan, R. Ye, Y. Li, S. P. Singh, C. J. Arnusch, J. M. Tour, *ACS Nano* 2018), the production of LSG from pure lignin has not been achieved. The transformation of lignin into graphene could realize large-scale and low-price production of graphene.

However, the present inventors have successfully prepared high-quality LSG from water-soluble lignin films by a one-step lasing technique. The inventors have also developed a lignin-based laser lithography process and used it to fabricate MSCs and biosensors on various substrates. The lignin-based laser lithography to be discussed herein allows the free fabrication of MSCs with various 3D graphene electrode designs using a simple water-based lift-off process.

The use of lignin, which is a natural polymer unlike polyimide, is very advantageous not only because of the sustainability aspect of the process, but also because the process is very cheap as lignin is an actual waste by-product of the paper industry. Using naturally existing materials as opposed to polyimide, which has to be synthesized, is more sustainable and more cost effective.

According to an embodiment, a lignin-polymer composite film was prepared by blade-coating on a substrate. The polymer (for example Poly(vinyl) alcohol (PVA)) in the composite film acts as a binder to make a homogeneous lignin film. Laser scribing is then conducted with a commercial laser cutting machine. During the laser scribing process, the lignin in the composite film is selectively transformed into a porous graphene film, while the polymer is decomposed by laser irradiation. After laser scribing, a water lift-off process is used to fabricate the MSC and sensor patterns. The lignin not transformed to graphene and still present on the substrate is washed away by the water. Those parts of the lignin that were transformed to graphene remain on the substrate and act both as a current collector and active materials for MSCs. Through this way, it is possible to fabricate 3D porous graphene electrode patterns. In one application, other films and/or materials may be deposited on the scribed graphene patterns, for example, an Au film, to increase its power performance, or oxide film (e.g., $MnO_2$) to increase its energy performance. These methods are now discussed in more detail.

Figure 2A:
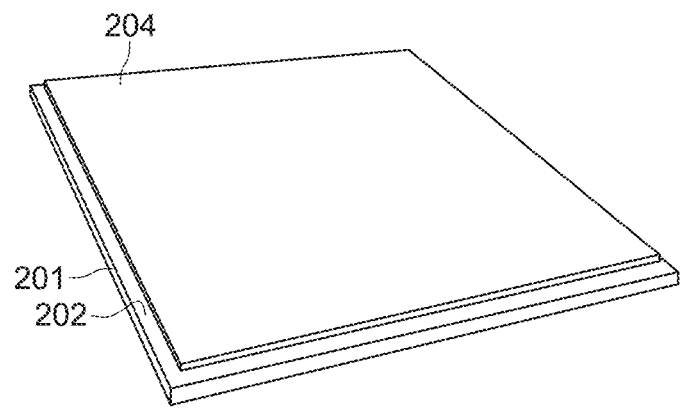
FIGS. 2A to 2D illustrate the various phases of forming the graphene structure.

A method for forming an electrode with the lignin lithography process noted above is now discussed with regard to FIG. 1. In step 100, a substrate 202 is provided (see FIG. 2A). The substrate 202 may include any materials, for example, a metal, glass, silicon, or polymer. The substrate 202 may be flexible and may be placed on a base 201. The base 201 may be made of any material. In step 102, the water-soluble lignin is mixed up with (i) a polymer binder and (ii) with a solvent to form the lignin-polymer composite film 204. The composite film 204 is coated to top of the substrate 202 in step 104. In one application, the percentage by weight of the water-soluble lignin in the composite film 204 is from 5 to 60, the percentage of the polymer is between 5 and 20, and the rest is the solvent. In one application, the water-soluble lignin is about 10%, the polymer is about 10%, and the solvent is about 80%. These numbers may be adjusted in the ranges noted above.

The addition of the polymer binder enhances the quality of the graphene electrodes. Applying the laser treatment only on the lignin by itself will not produce a good result.

The strength, adhesion, and reliability of the graphene electrodes derived from lignin alone is not so good. They are fragile, not as porous, and not as conductive. The polymer added to lignin (PVA in this case) helps in several ways: (1) acts as a binder that binds the 3D graphene more strongly to itself and to the substrate, and (2) creates a more porous and hence more electroactive electrode due to a larger surface area (the PVA polymer itself is decomposed in the process.)

In one specific implementation of this method, the water-soluble lignin is alkaline lignin (471003, Sigma-Aldrich). This kind of lignin is not only water-soluble, but also contains about 4 wt % sulfur in the form of sodium sulfonate. Note that the raw lignin is insoluble in water. Further, in this specific implementation, the solvent used for forming the lignin-polymer composite film is water and the polymer is PVA. For example, 10 g lignin was mixed with 10 g PVA (average $M_W$ 89000, Sigma-Aldrich) in 100 mL deionized water with stirring in a 60° C. oil bath for 4 hours. The room-temperature of the lignin-PVA solution was used to prepare the lignin-PVA composite film with a blade coating technique. In this application, the substrate is an ozone treated plastic film (e.g., Polycarbonate (PC), polymethyl methacrylate (PMMA) and/or polyethylene terephthalate (PET)). The thickness of the dried lignin-PVA composite film is about 40 μm in this implementation. Other thickness may be used. After drying in air for 24 hours, to remove the extra water, the lignin-PVA composite film was ready to be used to conduct the laser scribing process.

Figure 2B:
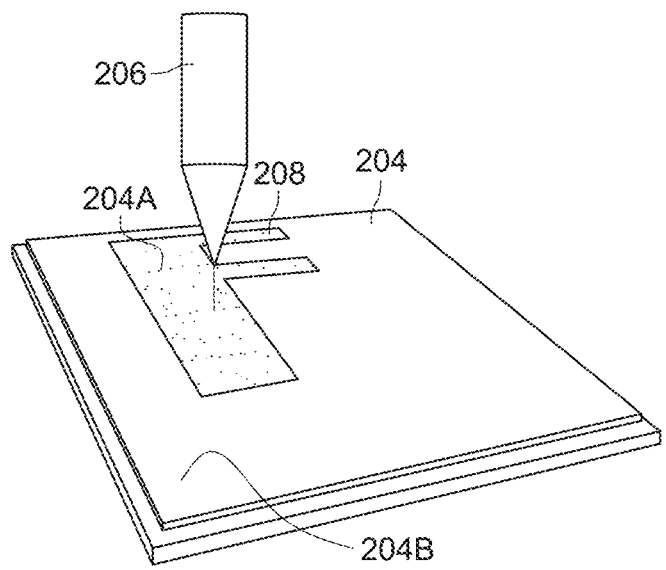
Figure 2C:
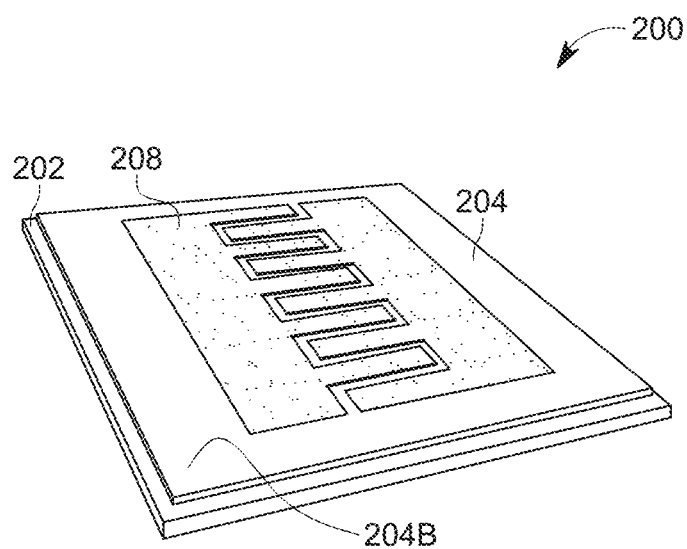

After drying, the lignin-polymer composite film 204 is processed in step 106 with a laser device 206 (see FIG. 2B) for laser scribing selected exposed regions into comb-like interdigitated electrodes 208. Note that during the laser scribing process of the water-soluble lignin, the lignin in a first part 204A of the composite film 204 undertakes a chemical reaction that transforms various components of the soluble lignin into graphene. However, the lignin in the second part 204B of the composite film 204, which is not exposed to the laser beam does not change its chemical properties. Thus, with the laser scribing process performed in step 106, a three-dimensional graphene structure 208 is obtained and this structure can have any designed shape as illustrated in FIG. 2C, as the laser irradiates the lignin-polymer composite film 204.

Figure 2D:
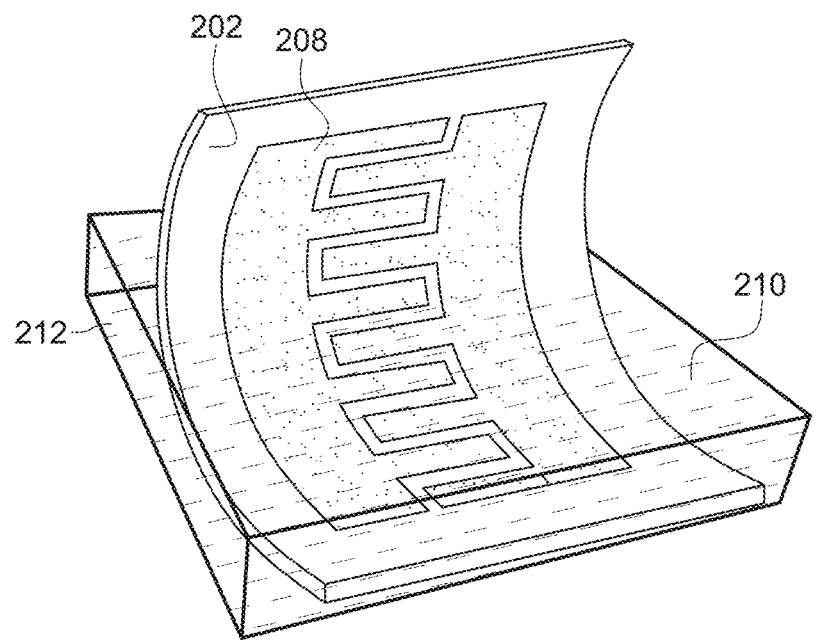

Next, in step 108, the method takes advantage of the fact that the lignin-polymer composite film 204 that has not been exposed to the laser beam dissolves in water. This means that in step 108, the assembly 200 (which includes the substrate 202, the lignin-polymer composite film 204, and the graphene electrode structure 208) is placed in water 210 in a vessel 212, as illustrated in FIG. 2D, which basically is a water lift-off process that removes the parts of the lignin-polymer composite film 204 that were not exposed to the laser 206. This step leaves the designed graphene electrode structure 208 attached to the surface of the substrate 202, but removes everything else. Because this method can pattern active shapes on the substrate using both laser and water-soluble lignin, the combined role of water-soluble lignin and laser makes a facile lithography technique, which is named herein lignin laser lithography (LLL). Then, in step 110, the substrate 202 together with the patterned electrode structure 208 are removed from the vessel 212 and used for various purposes.

Actual LSG electrode patterns fabricated using the LLL process can be generated on various substrates due to the compatibility of these substrates with the lignin-polymer composite film. For example, the LSG electrode patterns were formed using the LLL process on a polycarbonate (PC) substrate, a poly methyl methacrylatemethacrylic acid (PMMA) substrate, and a polyethylene terephthalate (PET) substrate. Also, the LLL process can be applied to make many different types of patterns, not only electrodes.

Figure 3A:
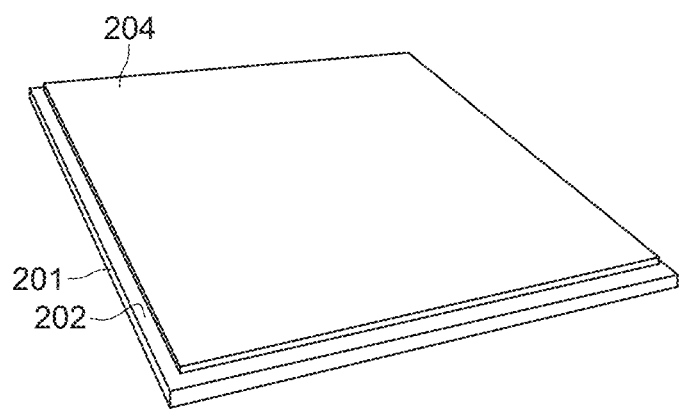
FIGS. 3A to 3D illustrate adding a metallic layer to the graphene structure.
Figure 3B:
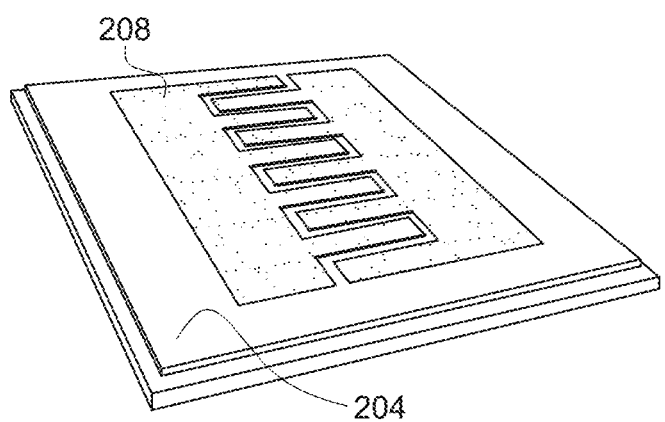
Figure 3C:
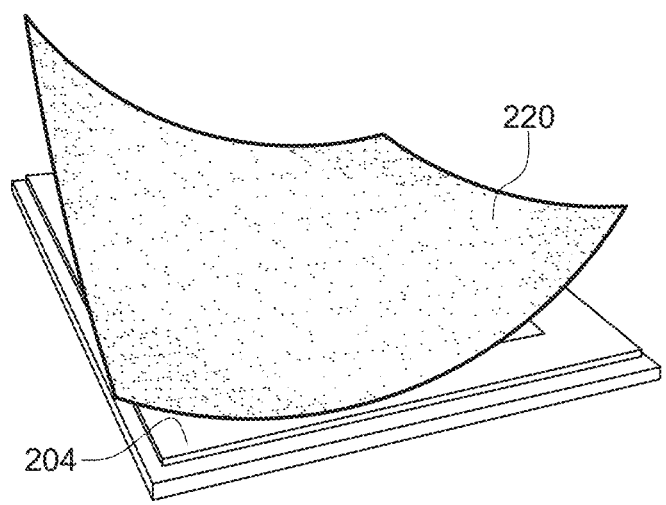
Figure 3D:
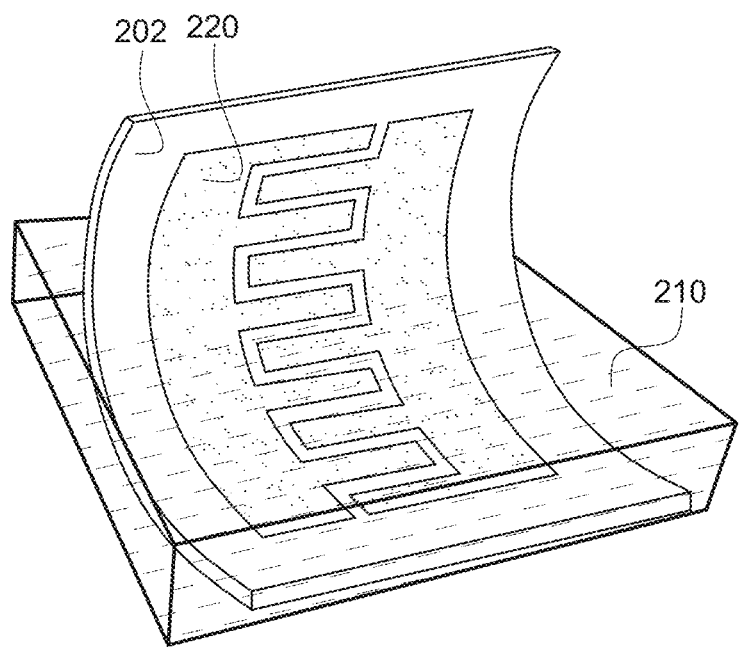

The LLL technique can be extended to make more complex functionalized or coated LSG electrodes, for example, to improve a supercapacitor's performance, or even for other applications. In the following, an example of improving a supercapacitor's performance is discussed with regard to FIGS. 3A-3D. FIG. 3A shows a lignin-polymer composite film 204 formed on top of the substrate 202, which is located on top of the base 201, as in FIG. 2A. FIG. 3B shows the patterned electrode structure 208 formed in the lignin-polymer composite film 204 with the laser 206. FIG. 3C shows the patterned electrode structure 208 and the lignin-polymer composite film 204 being coated with a layer 220 that includes a desired material. This step is performed before the water lift-off process. In this embodiment, layer 220 includes gold (Au) and is deposited over the electrode structure 208 to increase its electrical conductivity. Following Au coating, the assembly 200 was soaked in water 210, as illustrated in FIG. 3D, which resulted in the lift-off of the lignin and Au in the areas where the lignin was not exposed to the laser beam (note that exposed regions 204 are not present on the substrate 202 and regions 220 are now present only on top of the electrodes 208). However, the Au/LSG bilayer electrode 208/220 with the designed pattern remain on the substrate 202 after lignin lift-off. Those skilled in the art would understand that more layers may be added to the electrodes 208, for example, to form a better electrode or even another device such as a sensor or semiconductor device, as discussed later. In addition, this method may be used to integrate the MSC with other devices that use graphene electrodes.

The laser scribing process shown in FIGS. 2A to 3D may be conducted with a commercial $CO_2$ laser (10.6 μm). Note that other lasers may be used for this process. The beam size of the laser is about 100 μm. The peak laser power is 75 watt and the full scan speed is 75 inch per second. The laser pulse was set at 1000 dpi per inch. The laser power is from 2.4% to 4.0% of the total laser power with an increment of 0.4%. The scan rate was set at 3% and the laser beam was focused at a z distance of 3 mm. These numbers are exemplary and those skilled in the art would understand that other values may be used to achieve the same results.

After the laser scribing process and the washing step, the laser scribed assembly 200 may be placed into a 50° C. oven overnight to evaporate the extra water in LSG. The assembly 200 may then be assembled into a MSC with designed comb-like interdigitated electrodes. In this regard, note that a MSC (also called micro-supercapacitor) is a high-power device that bridges the gap between electrolytic capacitors and rechargeable batteries. They typically store 10 to 100 times more energy per unit volume or mass than electrolytic capacitors, can accept and deliver electrical charges much faster than batteries, and tolerate many more charge and discharge cycles than the rechargeable batteries. The lignin based micro-supercapacitors can be used to power miniaturized devices such as sensors that make up sensor networks as IoT (internet of thigs) as well as wearable sensors. In such applications the MSC can replace the battery since only intermittent measurements and require low power levels to the measure a signal an transmit it wirelessly. The MSC are used in applications requiring many rapid charge/discharge cycles rather than long term compact energy storage. Smaller units are used as memory backup for static random-access memory (SRAM). Unlike ordinary capacitors, supercapacitors do not use the conventional solid dielectric, but rather, they use electrostatic double-layer capacitance and electrochemical pseudocapacitance, both of which contribute to the total capacitance of the capacitor.

Silver paste was used to connect the LSG and copper terminals of the MSC and an epoxy resin was used to separate the active electrodes and the silver paste. After assembly, the electrodes of the MS were coated with 1 M $H_2SO_4$/PVA gel electrolyte.

Figure 4:
FIG. 4 shows a morphology of the graphene structure obtained from lignin.

The LSG electrodes formed based on the LLL methodology discussed above show similar morphology as the LSG electrodes made from polyimide. However, the lignin based LSG is twice as conductive as the polyamide LSG and this feature is desired for both electronic storage and sensing applications. However, there is no expansion during the laser scribing process, i.e., the thickness of the LSG electrode after laser exposure is comparable to the thickness of the lignin-polymer composite film, which could be due to the low compaction density of the lignin-polymer composite film caused by the filling of the non-reactive polymer. The morphology of the LSG electrodes obtained after lignin exposure to 4.0% laser power (denoted LSG-P40) is shown in FIG. 4. The coarse morphology with numerous embedded macropores 400 is due to the release of gaseous products (e.g., $H_2O$, CO and $CO_2$, etc.) during the laser scribing process. These large, numerous, macropores are also found in the TEM images, which is in accordance with the low resolution SEM images. The high resolution TEM images show that some fine nanopores also exist inside the electrodes. The above results demonstrate that the lignin-derived LSG electrodes have a hierarchical porous graphene morphology, which should be beneficial for electrochemical micro-supercapacitor applications. The HRTEM images indicate that LSG-P40 electrodes possess long graphene layers with an interface distance of about 0.347 nm. The above results show that that during the lignin laser lithography process, lignin has been successfully transformed into hierarchical porous graphene.

The LSG electrodes obtained with various laser powers have been studied with various tools, e.g., X-ray (XRD) analysis, Raman spectroscopy, Transmission Electron Microscopy (TEM), High Resolution TEM (HRTEM), etc. for determining their properties. The intense XRD peak of LSG-P36 centered at ca. 25.9° shows an interlayer spacing of 0.344 nm, which is consistent with the TEM results (0.347). The asymmetry of the (002) peak demonstrates that some disordered structure exist in the LSG structure. In addition, the large LSG-P36 macropores can facilitate the electrolyte diffusion throughout the electrode. With the further increase of laser power, some parts of the LSG film become detached from the surface. This is because, with increasing laser power, the surface of LSG evolves from closed pore morphology to open morphology and finally detaches from the substrate surface. High resolution images of the electrode display some small bright particles on the surface of LSGs, and these particles seem to protrude from the surface with increasing the laser power.

These particles were found to be $Na_2SO_3$ particles, which originate from the decomposition of sodium sulfonate in alkaline lignin and the crystallization of small $Na_2SO_3$ crystals. These particles are easily washed off during the washing process. The formation of $Na_2SO_3$ demonstrates that the formation of LSG is a combined photo-chemical and photo-thermal process. The inner structure of the LSG was further characterized via TEM upon the change of laser power. All the low magnification TEM images show the macroporous structure and the HRTEM shows nanopores, which demonstrates that the LSG structure is indeed a hierarchical porous carbon. With the increase in the laser power, an evolution of the formation of the graphene structures in LSG has been observed. For the LSG-P32 electrode (3.2% laser power), some disordered graphene can be observed, while when the laser power is increased to 3.6%, clearly stacked graphene layers can be observed.

Figure 5:
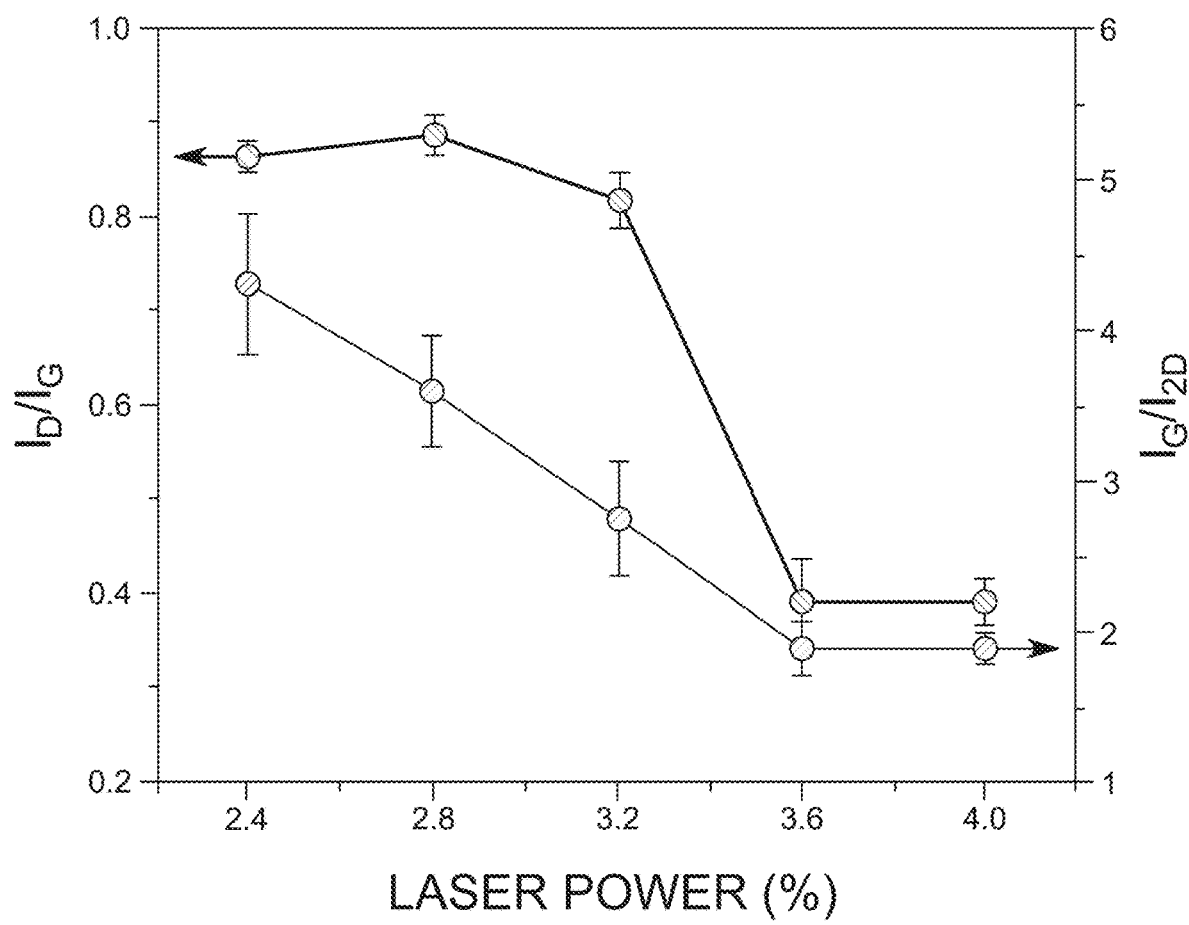
FIG. 5 illustrates a dependence of the ratio of the intensity of the D band to G band with the laser power applied during the laser scribing process for the lignin-based graphene.

Raman spectra of the lignin-derived LSG electrodes shows three dominant peaks: the D peak (K-point phonons of $A_{1g}$ symmetry) at 1360 $cm^{-1}$, which is induced by the defects in LSG, the first-ordered allowed G peak ($E_{2g}$ phonons of C $sp^2$ atoms) at 1570 $cm^{-1}$, and 2D peak at 2700 $cm^{-1}$ originating from the second order zone-boundary phonons. The 2D peaks were fitted by one Lorentzian peak, similar to single layer graphene. When lignin was irradiated with a laser power of 2.0% or below, no G and D peaks were observed. When the laser power increased to 2.4%, the lignin started to transform into low-graphitic carbon, as suggested by the broad D and weak 2D peak. A decreased D peak intensity and increased G and 2D peak intensity were observed when the laser power increased from 2.8% to 4.0%, which demonstrates the formation of better graphene structure. The Raman spectra was further analyzed and summarized in FIG. 5. It can be seen that the $I_D/I_G$ (intensity of the D band relative to the intensity of the G band) ratio (top line) becomes smallest when the laser power increased to 3.6, which means the crystallite size of the graphene is the largest. The LSG-P36 electrode shows the smallest $I_G/I_{2D}$ ratio (bottom line), indicating the stacking of fewest graphene layers. The results suggest that higher laser power generally leads to the formation of higher quality graphene.

The inner porous structure of the LSG electrode was characterized by $N_2$ adsorption-desorption analysis. The results indicate that the LSG-P36 electrode has a BET surface area of 338.3 $m^2$ $g^{-1}$ with a total volume of 0.232 $cm^3$ $g^{-1}$ and average pore diameter of 2.57 nm, which is similar to polyimide derived from LSG. The mesopores combined with the large macropores in the LSG form a hierarchical porous structure, which is beneficial for supercapacitor performance. The large macropores facilitate electrolyte flow, while the smaller pores can act as active sites. The conductivity of LSG electrode was evaluated by two separate methods. For the current-voltage measurements, an LSG strip of length of 2 cm and width of 3 mm was used to measure the conductivity. The measured I-V curves show linear behavior expected for resistors.

The chemical composition of LSG was analyzed by photoelectron spectroscopy (XPS). The C1 s peak was fitted into four components, including the $sp^2$ C=C bond located at 284.4 eV, the C—O bond located at 285.7 eV, the C=O bong located at 288.5 eV, and C(O)OH located at 290.5 eV. It was found that the concentration of $sp^2$ C=C bonds increased with laser power, and stabilized at around 75% at a laser power of 3.6%. In contrast, the concentration of the C—O bonds decreased with laser power. The increase of $sp^2$ C=C bond with laser power is expected to increase the conductivity of LSG. Owing to the relatively low content of $sp^2$ C=C bond in LSG-P24 and LSG-P28, these configurations exhibit lower conductivity.

The electrochemical performance of MSCs having interdigital electrodes fabricated using the LLL process has also been evaluated. It has been found that the LSG electrodes fabricated using various laser powers all show symmetric quasi-rectangular C-V curves indicating fast EDLC type charge storage mechanism. The dependence of areal capacitance of LSG electrodes on laser power shows that the capacitance increases with the decrease in the laser power.

For example, the LSG-P24 electrodes exhibit the largest areal capacitance while the LSG-P40 electrodes exhibit the lowest. On the other hand, the LSG-P28, LSG-P32 and LSG-P36 electrodes show comparable performance. This result is consistent with e CV curves and may be due to the oxidation of carbon surface resulting in the detached carbon flakes from LSG. The fastest capacitance decay with scan rate (low rate capability) is observed for the LSG-P24 compared with other LSG electrodes, which could be due to the high internal resistance of LSG-P24.

The charge-discharge (CD) curves of LSG electrodes prepared at different laser powers are all fairly symmetric and triangular in shape, indicating good capacitive behavior. The capacitances calculated from the CD curves for different laser powers are generally consistent with those obtained from the CV curves, where the areal capacitance decreases with increasing laser power.

The LSG-P24 electrodes show higher capacitance compared with that in the CV test, i.e., the LSG-P24 shows a capacitance of 17 mF cm$^{-2}$ at a current density of 0.05 mA cm$^{-2}$. The tendency of capacitance vs laser power is revealed by a Nyquist plot. The LSG-P24 shows a low $Z_{im}$ with the same frequency compared with other LSGs, which means that the LSG-P24 electrode possesses the highest capacitance, which can be deduced from Equation 1.

$$C = \frac{-1}{2\pi f Z_{im}} \qquad (1)$$

The Nyquist plot also shows the internal resistance. With the increase of laser power, the internal resistance decreases, which is in accordance with the ohmic resistance in the resistance test.

The comparison of the capacitance of LSG based MSCs prepared at different powers and at different current density indicates that the capacitance decreases at higher current density.

The energy and power density of the MSCs using water-soluble lignin derived LSG electrodes were calculated at different powers. All the MSCs can be charged-discharged at a high current density of 10 mA cm$^{-2}$, which reveals the high power characteristic of LSG MSCs (up to 1000 mW cm$^{-3}$). LSG-P24 shows the highest areal energy density of 0.002 mWh cm$^{-2}$ and the volumetric energy density of 0.6 mWh cm$^{-3}$. The cycling stability of LSG MSc has been tested at a current density of 2.0 mA cm$^{-2}$ and it was found that the LSG MSC exhibits stable capacitance for more than 12 thousand cycles.

The performance improvement of LSG MSC was further enhanced by sputtering an Au coating on top of the LSG to increase the conductivity of the finger electrodes, as discussed with regard to FIGS. 3A to 3D. The direct sputtering of Au is performed after the laser-scribing process over the entire substrate surface (see FIG. 3C). C-V curves of micro-supercapacitors with Au/LSG electrodes exhibit a larger current than the same curves for the LSG electrodes without the layer of Au. A scan rate of up to 500 V s$^{-1}$ can be used while retaining a reasonable look for the CV curve. One of the other advantages of the Au coating is the increased capacitance of the MSC at low scan rates. The capacitance of LSG-P36-Au possesses a high capacitance of 11.9 mF cm$^{-2}$ at 0.02 mA cm$^{-2}$, which is almost double than that of uncoated LSG-P36 electrode (6.5 mF cm$^{-2}$). The increased capacitance of the LSG with Au coating is due to a better charge carrier distribution in the horizontal direction of finger electrodes, which makes full utilization of the meso-micro porous structure of LSG-P36. Although the capacitance at low current density increased, the capacitance at high current density decreased. This is most likely because the Au coating can partially cover some of the pores on the LSG surface. The power density of LSG was improved by Au coating, the highest power of LSG-P36 is 3.37 mW cm$^{-2}$, and the highest power for LSG-P36-Au is 5.79 mW cm$^{-2}$.

In addition, the inventors have evaluated the volumetric energy and power density of the Au-coated electrodes. For example, the LSG-P24-Au electrode results in a high volumetric energy density of ca. 0.99 mWh cm$^{-3}$, combined with 0.657 mWh cm$^{-3}$ of LSG-P24. LSG-P24-Au delivers a highest volumetric power density of 1704.5 mW cm$^{-3}$ compared with 641.7 mW cm$^{-3}$ of LSG-P24. LSG-P24-Au MSC is much higher than the LIG based MSC (close to 0.2 mWh cm$^{-3}$), the carbon quantum dot derived graphene MSC (0.04 mWh cm$^{-3}$), and also higher than born doped LIG based MSC (5B-LIG-MSC, ca. 0.6 mWh cm$^{-3}$). In fact, the volumetric energy density of LSG-P24-Au MSC is comparable to the LIG based MSC using ion liquid electrolyte (about 1 mWh cm$^{-3}$).

The areal energy density of the lignin-derived LSG MSCs is comparable to LIG MSC (L. Cao, S. Yang, W. Gao, Z. Liu, Y. Gong, L. Ma, G. Shi, S. Lei, Y. Zhang, S. Zhang, R. Vajtai, P. M. Ajayan, *Small* 2013, 9, 2905), MoS$_2$ MSC (Id.), Ppy circular MSC (L. Li, C. Fu, Z. Lou, S. Chen, W. Han, K. Jiang, D. Chen, G. Shen, *Nano Energy* 2017, 41, 261) and is much higher than the MPG MSC (Z. Wu, K. Parvez, X. Feng, K. Müllen, *Nat. Commun.* 2013, 4, 2487), NiFe$_2$O$_4$ (S. Gu, Z. Lou, L. Li, Z. Chen, X. Ma, G. Shen, *Nano Res.* 2016, 9, 424), GO/MWNT (J. Yun, D. Kim, G. Lee, J. S. Ha, Carbon N. Y. 2014, 79, 156), GO/MWNT/MnO$_x$ (Y. S. Moon, D. Kim, G. Lee, S. Y. Hong, K. K. Kim, S. M. Park, J. S. Ha, Carbon N. Y. 2015, 81, 29) and rGO/Fe$_2$O$_3$ MSCs (S. Gu, Z. Lou, L. Li, Z. Chen, X. Ma, G. Shen, Nano Res. 2016, 9, 424). The long-term cycling stability of LSG-P36-Au was demonstrated by the ultra-stable cycling performance of MSC for over 12 thousand cycles. The available surface coating makes the LLL process a more applicable method to prepare advanced MSC based on the porous graphene electrodes.

According to one or more of the above embodiments, laser scribed 3D graphene electrodes were formed from a lignin-polymer composite film that includes a water-soluble lignin, a binding polymer and a solvent. A lignin laser lithography process was developed to pattern the electrodes for micro-supercapacitor fabrication using water lift-off process. The water-soluble lignin derived LSG film can be prepared on several substrates due to the unique water-soluble properties of lignin in water. This LSG film can be further processed to receive an Au film to further increase the conductivity of LSG MSC along the finger electrode direction. The lignin laser lithography provides a sustainable process, since it does not use toxic precursors and organic solvent. The versatility and environmental friendliness of lignin laser lithography can inspire both the fabrication of MSC, production of graphene, and the sustainable utilization of lignin.

Figure 6:
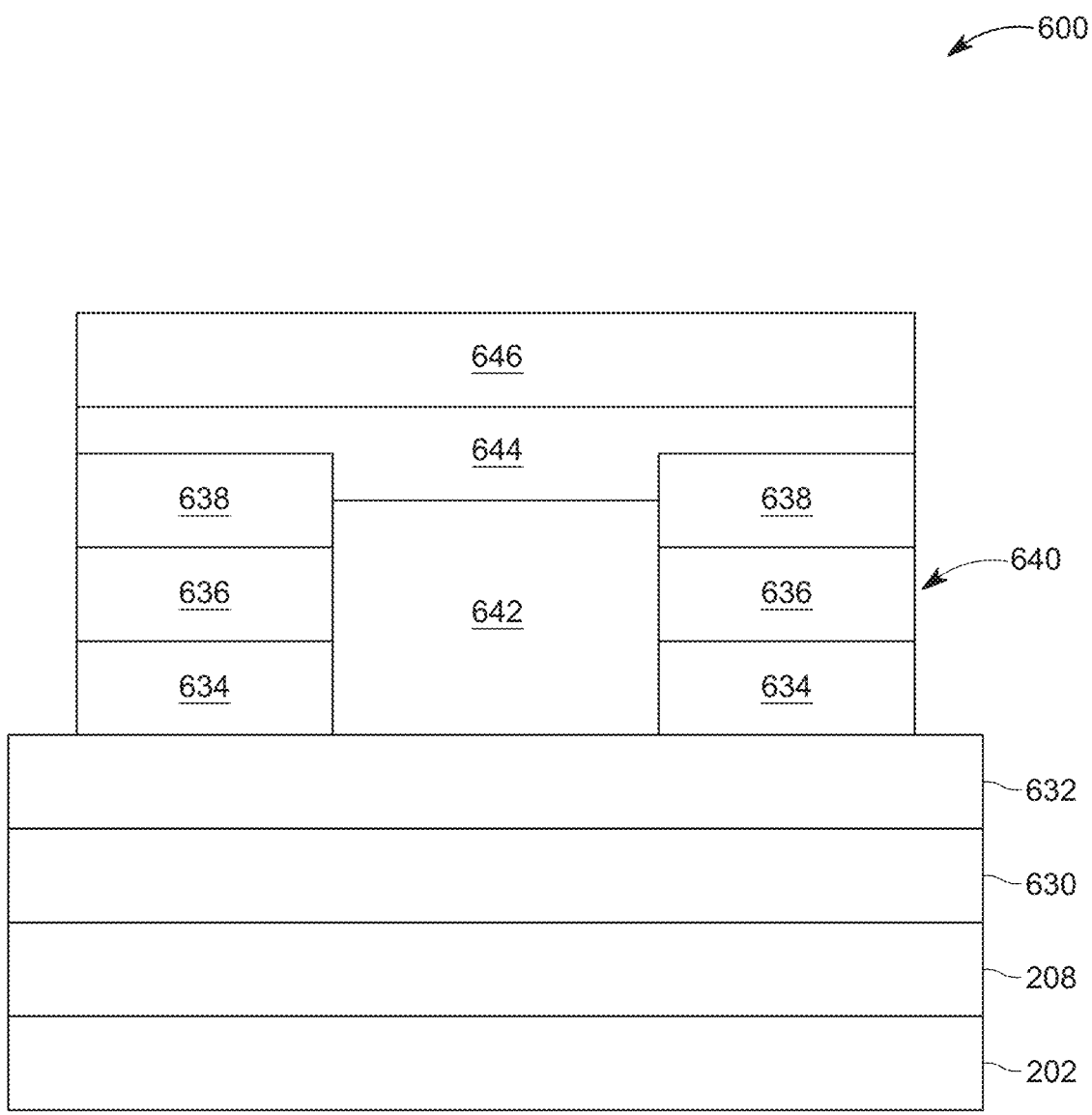
FIG. 6 illustrates a transistor formed with a graphene structure obtained from lignin.

In another embodiment, which is illustrated in FIG. 6, the LLL technology discussed above is used to manufacture a transistor. Other electronic devices may be similarly constructed. FIG. 6 shows a transistor 600 formed on top of a substrate 202 and having the electrode structure 208 as a gate electrode. In this case, the electrode structure 208 is not an interdigitated electrode, but a simple plane electrode. A gate insulator 630 is then formed over the electrode 208 followed by the deposition of an intrinsic semiconductor layer 632. Then, one or more stacks 640 are formed over the intrinsic semiconductor layer 632. In one embodiment, each stack includes an injection layer 634, a source or drain layer 636, and an insulator layer 638. Another intrinsic semiconductor layer 642 may be formed between the stacks, on the first intrinsic semiconductor layer 632. A dopped semiconductor layer 644 is formed over the second intrinsic semiconductor layer 642 and a drain or source layer 646 is formed over the second intrinsic semiconductor layer 644. The first and second intrinsic semiconductor layers may include organic materials, so that the transistor 640 shown in FIG. 6 may be an organic field effect transistor (OFET). Those skilled in the art would understand that other types of transistors may be formed on or using the electrode structure 208.

Figure 7A:
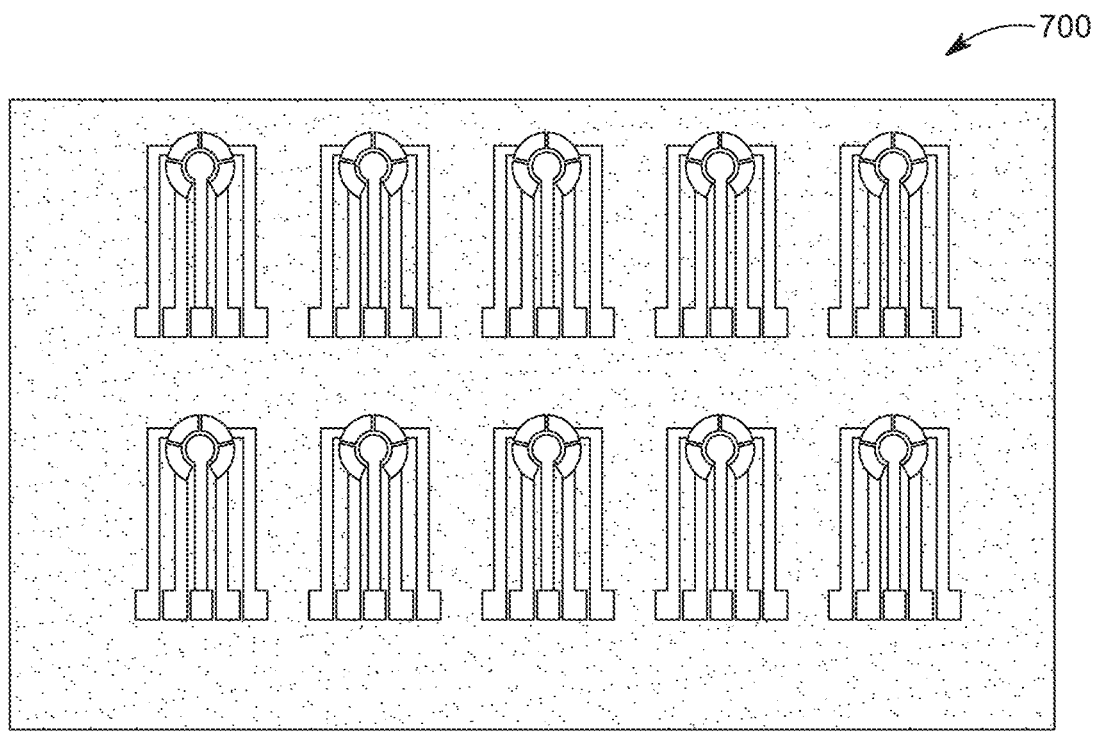
FIGS. 7A and 7B illustrate a multifunctional sensor pattern from the LSG induced substrate before and after a water lift-off process, respectively.
Figure 7B:
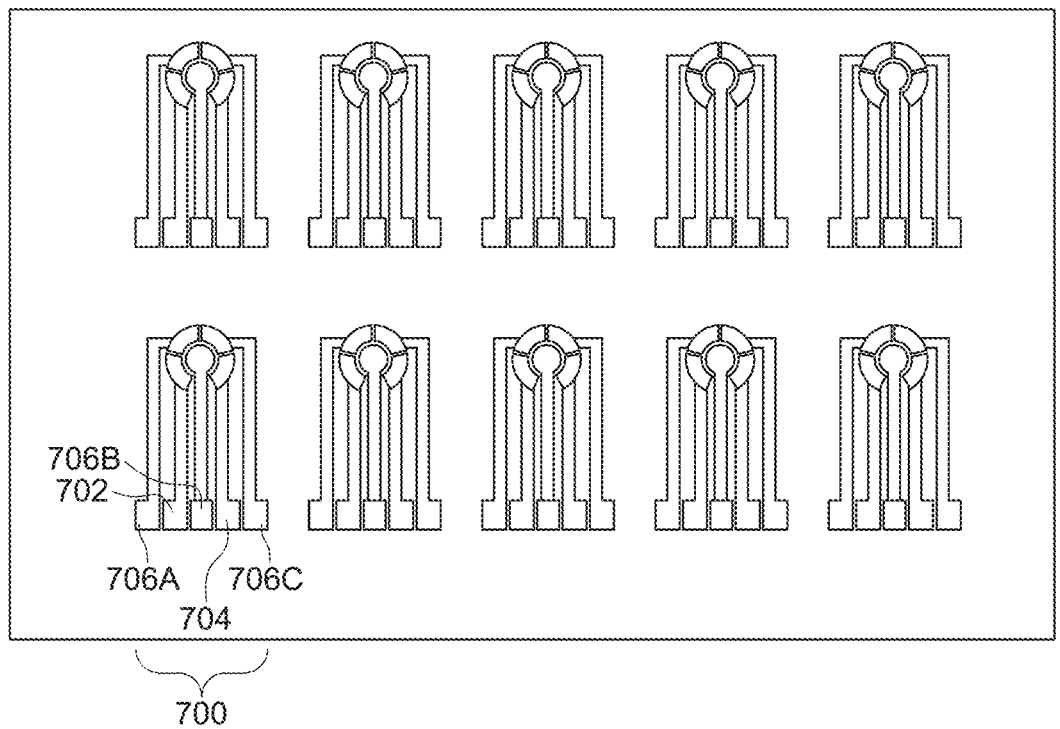
Figure 8A:
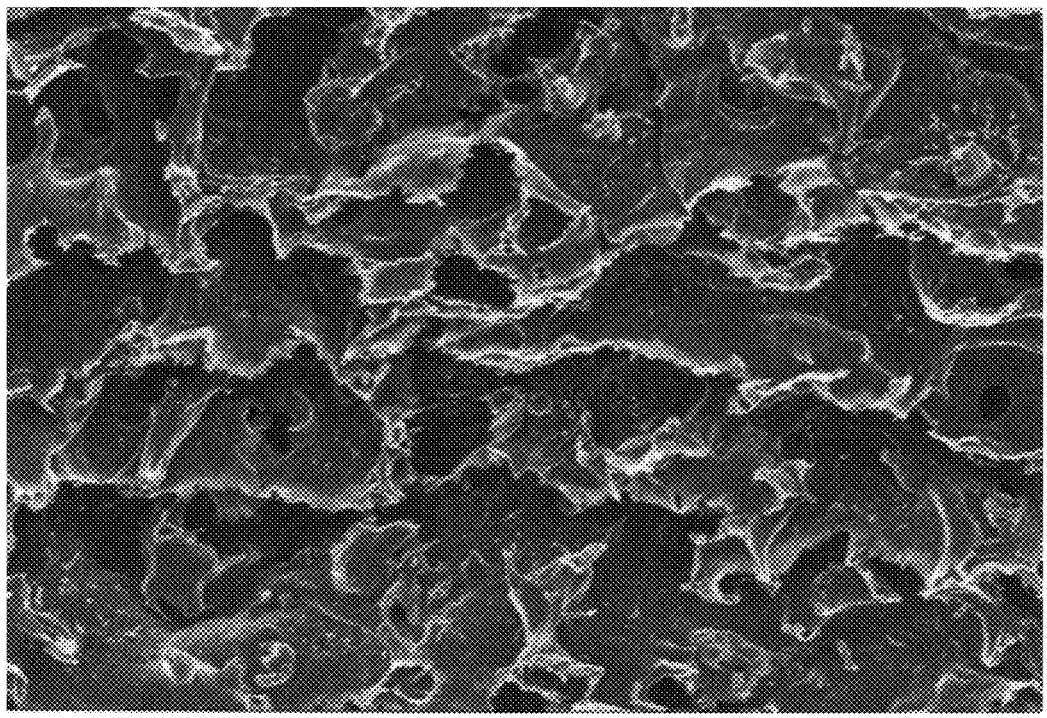
FIG. 8A illustrates the SEM image of LSG electrodes after a laser scribing process, before a water lift-off process.
Figure 8B:
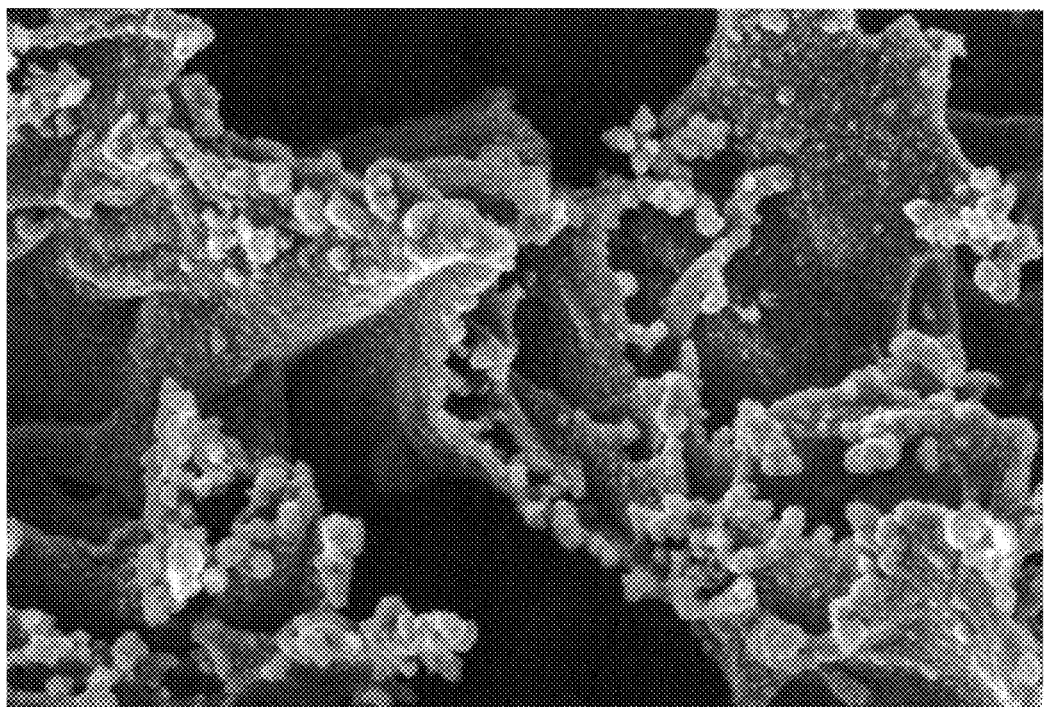
FIG. 8B illustrates the SEM images of the LSG electrodes after electrodeposition of prussian blue.
Figure 9A:
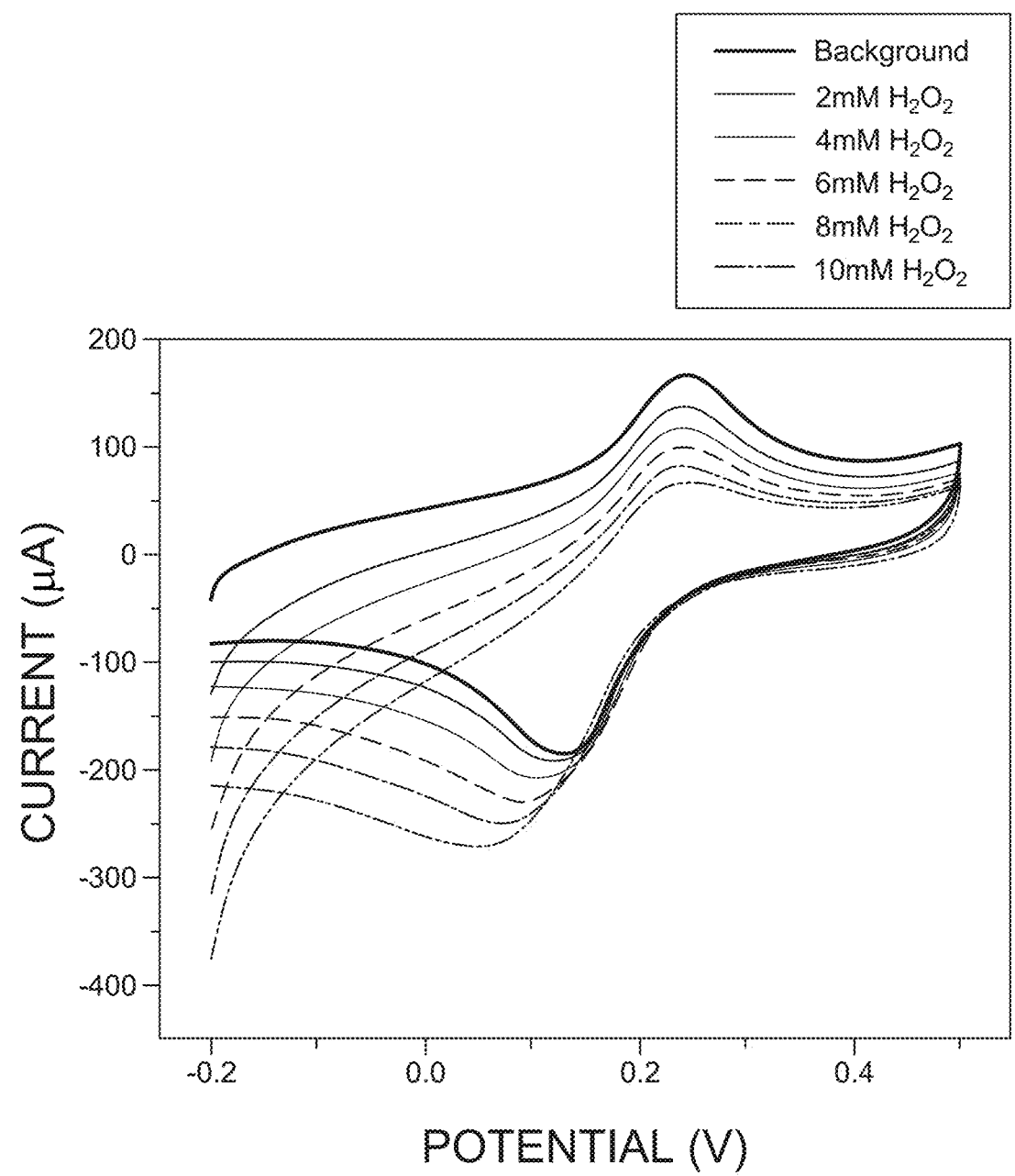
FIGS. 9A and 9B illustrate the performance of the $H_2O_2$ sensor based on LSG/Prussian blue.
Figure 9B:
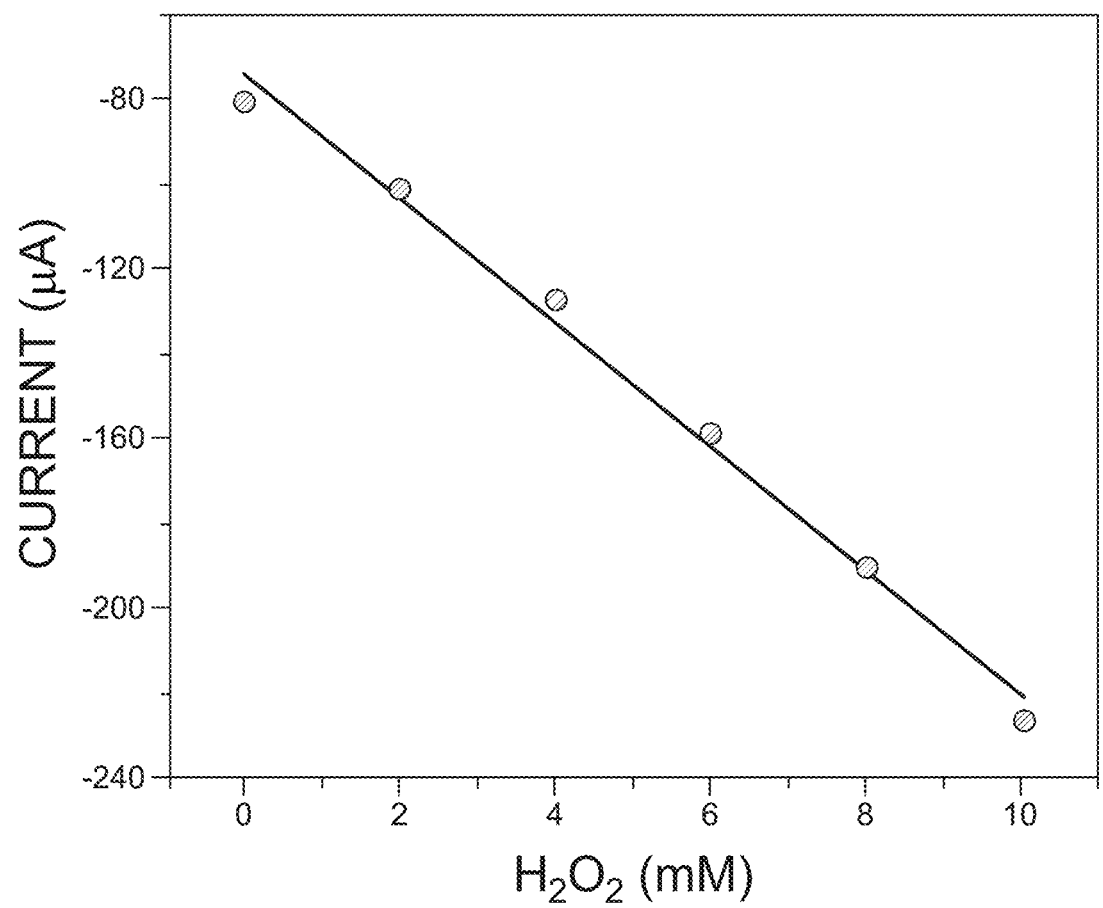

LSG electrode patterns fabricated using the LLL process discussed above were used to prepare a biosensor for hydrogen peroxide detection. The obtained hydrogen peroxide sensor 700 is shown in FIG. 7A before the water lift-off process and in FIG. 7B after the water lift-off process. The biosensor 700 works in a three electrode configuration, i.e., the biosensor 700 has a reference electrode 702, a counter electrode 704, and a working electrode 706. The working electrode 706 has three working electrodes 706A to 706C, which are integrated together to improve the accuracy of the biosensor 700 (five electrodes on one chip). The SEM image of an LSG electrode after laser scribing and before water lift-off process is shown in FIG. 8A while FIG. 8B shows the same after Prussian blue was electrodeposited on the working electrode 706 to work as the active material. Different concentrations of a hydrogen peroxide solution were tested by the sensor chip 700, and current-voltage (CV) characteristics corresponding to the electroreduction of the hydrogen peroxide on the LSG/PB electrodes are illustrated in FIG. 9A. A calibration plot derived from the CVs at −0.1 V versus Ag/AgCl is shown in FIG. 9B.

The disclosed embodiments provide electronic structures (e.g., electrodes) and methods for generating 3D Graphene patterns from water-soluble lignin. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method for forming a three dimensional or porous graphene electrode pattern on a substrate, the method comprising:
   providing a substrate;
   coating the substrate with a lignin-polymer composite film;
   exposing a first part of the coated lignin-polymer composite film to a laser beam for transforming the first part into the graphene pattern; and
   removing a second part of the coated lignin-polymer composite film, which was not exposed to the laser beam, by placing the second part in water,
   wherein the lignin-polymer composite film includes (1) a water-soluble alkaline lignin, (2) a polymer having bonding properties, and (3) a solvent, and an amount of the water-soluble alkaline lignin in the lignin-polymer composite film is between 5 and 60% by weight.

2. The method of claim 1, further comprising:
   laser scribing the first part of the coated lignin-polymer composite film to form in-plane interdigitated electrodes on the substrate, wherein the graphene pattern is electrically conductive.

3. The method of claim 2, further comprising:
   placing the in-plane interdigitated electrodes in supercapacitors, biosensors, or another electronic device.

4. The method of claim 1, further comprising:
   after the step of exposing, and before the step of removing, coating the first and second parts of the lignin-polymer composite film with a metallic layer.

5. The method of claim 4, wherein the metallic layer includes gold.

6. The method of claim 4, wherein the step of removing removes only the second part of the lignin-polymer composite film and a part of the metallic layer that is on top of the second part, but not the first part and another part of the metallic layer that is on top of the first part.

7. The method of claim 4, further comprising:
   after removing the second part of the lignin-polymer composite film, forming a semiconductor device over the first part.

8. The method of claim 1, wherein the solvent is water and the polymer having bonding properties is Poly(vinyl) alcohol (PVA).

9. The method of claim 1, wherein the lignin-polymer composite film includes (1) 10% by weight of the water-soluble alkaline lignin, (2) 10% by weight of the polymer having bonding properties, and (3) 80% by weight of the solvent.

10. The method of claim 1, wherein the water-soluble alkaline lignin includes sulphur.

11. A method for generating a graphene pattern on a substrate, the method comprising:
    coating a substrate with a lignin-polymer composite film;
    laser scribing a first part of the coated lignin-polymer composite film for transforming the first part into the graphene pattern; and
    washing away with water a second part of the coated lignin-polymer composite film, which was not laser scribed,
    wherein the lignin-polymer composite film includes (1) a water-soluble alkaline lignin, (2) a polymer having bonding properties, and (3) a solvent.

12. The method of claim 11, wherein an amount of the water-soluble alkaline lignin in the lignin-polymer composite film is between 5 and 60% by weight.

* * * * *